(12) United States Patent
Rameau et al.

(10) Patent No.: US 9,886,528 B2
(45) Date of Patent: Feb. 6, 2018

(54) DESIGNING A 3D MODELED OBJECT WITH 2D VIEWS

(71) Applicant: DASSAULT SYSTEMES, Velizy Villlacoublay (FR)

(72) Inventors: Jean-François Rameau, Lisses (FR); Alain Fauchet, Le Port Marly (FR); Jonathan Cloux, Le Plessis Robinson (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 924 days.

(21) Appl. No.: 14/290,639

(22) Filed: May 29, 2014

(65) Prior Publication Data
US 2014/0358496 A1    Dec. 4, 2014

(30) Foreign Application Priority Data

Jun. 4, 2013  (EP) .................................... 13305751

(51) Int. Cl.
*G06F 17/50*    (2006.01)
*G06T 17/00*    (2006.01)

(52) U.S. Cl.
CPC .............. *G06F 17/50* (2013.01); *G06T 17/00* (2013.01)

(58) Field of Classification Search
None
See application file for complete search history.

(56) References Cited

U.S. PATENT DOCUMENTS

| 6,549,201 | B1 * | 4/2003 | Igarashi | G06T 17/20 345/423 |
| 6,654,027 | B1 * | 11/2003 | Hernandez | G06T 19/00 345/581 |
| 8,570,343 | B2 | 10/2013 | Halstead | |
| 2002/0028418 | A1 | 3/2002 | Farag | |
| 2002/0172413 | A1 | 11/2002 | Chen | |
| 2003/0206165 | A1 | 11/2003 | Hoppe | |
| 2005/0033142 | A1 | 2/2005 | Madden | |

(Continued)

FOREIGN PATENT DOCUMENTS

| CN | 104 794 722 | 7/2015 |
| CN | 105 657 402 | 6/2016 |

(Continued)

OTHER PUBLICATIONS

Lavoue, G., et al., "Markov Random Fields For Improving 3D Mesh Analysis and Segmentation," Eurographics Workshop on 3D Object Retrieval (2008).

(Continued)

*Primary Examiner* — Yu Chen
(74) *Attorney, Agent, or Firm* — Hamilton, Brook, Smith & Reynolds, P.C.

(57) ABSTRACT

It is provided a computer-implemented method designing a three-dimensional modeled object, comprising the steps of providing (S10) a plurality of two-dimensional views of the modeled object, a three-dimensional wireframe graph, associating (S20), to each vertex of the wireframe graph, a local radial order between all the edges incident to the vertex, and then determining (S30) edge cycles, by browsing the wireframe graph following the local radial orders associated to the vertices. Such a method improves the design of a 3D modeled object.

16 Claims, 11 Drawing Sheets

(56) References Cited

U.S. PATENT DOCUMENTS

| 2009/0202160 | A1 | 8/2009 | Kim |
| 2009/0284550 | A1* | 11/2009 | Shimada ............ G06F 17/5095 345/619 |
| 2011/0295564 | A1* | 12/2011 | Chazal .................. G06F 17/50 703/1 |
| 2013/0251241 | A1 | 9/2013 | Kunkel et al. |
| 2013/0321403 | A1 | 12/2013 | Piemonte |
| 2014/0064581 | A1 | 3/2014 | Madbhushi |
| 2014/0267279 | A1 | 9/2014 | Kontkanen |
| 2014/0340489 | A1 | 11/2014 | Medioni |
| 2014/0362091 | A1 | 12/2014 | Bouaziz et al. |
| 2015/0142394 | A1 | 5/2015 | Mehr et al. |
| 2015/0213646 | A1 | 7/2015 | Ma et al. |
| 2015/0279118 | A1 | 10/2015 | Dou et al. |
| 2015/0347846 | A1 | 12/2015 | Guzman-Rivera et al. |
| 2016/0127715 | A1 | 5/2016 | Shotton et al. |
| 2016/0171765 | A1 | 6/2016 | Mehr |
| 2017/0193699 | A1 | 7/2017 | Mehr et al. |

FOREIGN PATENT DOCUMENTS

| EP | 0 822 522 | 2/1998 |
| WO | WO 2011/142734 | 11/2011 |
| WO | WO 2012/048304 | 4/2012 |
| WO | WO 2013/189058 | 12/2013 |
| WO | WO 2016/050290 | 4/2016 |

OTHER PUBLICATIONS

Lee, Chang H., et al., "Mesh Saliency," Dept. of Computer Science, University of MD.

Lee, J., et al., "Interactive Retexturing from Unordered Images," 2014 11th International Conference on Ubiquitous Robots and Ambient Intelligence, pp. 18-21 (Nov. 12, 2014).

Xu, L., et al., "A General Texture Mapping Framework for Image-based 3D Modeling," 2010 Proceedings of 17th IEEE International Conference on Image Processing, 2010, pp. 2713-2716.

Komodakis, N., et al.,. "Image Completion Using Efficient Belief Propagation Via Priority Scheduling and Dynamic Pruning," IEEE Transactions on Image Processing 2007.

Komodakis, N., et al., "MRF Optimization via Dual Decomposition: Message Passing Revisited," IEEE Trans. 2011.

Komodakis, N., "Image Completion Using Global Optimization," CVPR 2006.

Kolmogorov, V. . "Convergent Tree-Reweighted Message Passing for Energy Minimization," Pattern Analysis and Machine Intelligence, IEEE 2006.

Zheng Jian-dong et al., "3D Curve Structure Reconstruction From a Sparse Set of Unordered Images," Computers in Industry 60 (2009).

Krizhevsky, Alex, Ilya Sutskever, and Geoffrey E. Hinton. "ImageNet Classification With Deep Convolutional Neural Networks." *Advances in neural information processing systems*. 2012.

Loper, Matthew M., and Michael J. Black. "OpenDR: An Approximate Differentiable Renderer." *European Conference on Computer Vision*. Springer International Publishing, 2014.

Chen, Yinpeng, Zicheng Liu, and Zhengyou Zhang. "Tensor-Based Human Body Modeling." *Proceedings of the IEEE Conference on Computer Vision and Pattern Recognition*. 2013.

Bălan, Alexandru O., and Michael J. Black. "The Naked Truth: Estimating Body Shape Under Clothing." *European Conference on Computer Vision*. Springer Berlin Heidelberg, 2008.

Bălan, Alexandm O., et al. "Detailed human shape and pose from images." 2007 *IEEE Conference on Computer Vision and Pattern Recognition*. IEEE, 2007.

Guan, Peng, et al. "Estimating Human Shape and Pose From a Single Image." 2009 *IEEE 12th international Conference on Computer Vision*. IEEE, 2009.

Weiss, Alexander, David Hirshberg, and Michael J. Black. "Home 3D Body Scans From Noisy Image and Range Data." 2011 *International Conference on Computer Vision*. IEEE, 2011.

Perbet, Frank, et al. "Human Body Shape Estimation Using A Multi-Resolution Manifold Forest." *Proceedings of the IEEE Conference on Computer Vision and Pattern Recognition*. 2014.

Gschwandtner, M., et al., "BlenSor: Blender Sensor Simulation Toolbox", Advances in Visual Computing: $7^{th}$ International Symposium, vol. 6939/2011 pp. 199-208, 2011.

Nguyen, C., et al., "Modeling Kinect Sensor Noise for Improved 3D Reconstruction Tracking", 2012 Second Joint 3DIM/3DPVT Conference: 3D Imaging, Modeling, Processing, Visualization & Transmission, IEEE, 2012.

Chattrjee, A., et al., "Noise in Structured-Light Stereo Depth Cameras: Modeling and its Applications", Dept. of Engineering, Indian Institute of Science, Bengaluru, May 8, 2015.

Belhedi, A., "et al.", Noise Modelling and Uncertainty Propagation for TOF Sensors, International Conference of Computer Vision, 2012.

Zeng, M., et al. "Dynamic Human Surface Reconstruction Using a Single Kinect", 13th International Conference on Computer-Aided Design and Computer Graphics, 2013.

Leizea, I., et al. "Real-time Deformation, Registration and Tracking of Solids Based on Physical Simulation", IEEE International Symposium on Mixed and Augmented Reality, Science and Technology Proceedings, Sep. 10-12, 2014.

Zollhöfer, M., et al. "Real-time Non-rigid Reconstruction using an RGB-D Camera", ACM Transactions on Graphics, vol. 22, No. 4, Article 156, Jul. 2014.

Leizea, I., et al., "Development and Improvement of Optical Tracking Methods towards Registering the Deformations of 3D Non-Rigid Bodies in Real Time for Augmented Reality Applications", Ph.D. Thesis, pp., 1-314, Feb. 2015.

EP Search Report for EP 15 30 7199 dated Jun. 17, 2016 "Reconstructing a 3D Modeled Object".

European Search Report for EP 16 18 8268 dated Feb. 21, 2017.

Handa, A., et al., "A Benchmark for RGB-D Visual Odometry, 3D Reconstruction and SLAM", 2014 IEEE International Conference on Robotics and Automation (ICRA), IEEE, pp. 1524-1531, May 31, 2014.

Handa, A., et al., "Understanding Real World Indoor Scenes with Synthetic Data", 2016 IEEE Conference on Computer Vision and Pattern Recognition (CVPR), IEEE, pp. 4077-4085, Jun. 27, 2016.

Xu, K., et al., "Data-Driven Shape Analysis and Processing" Computer Graphics Forum, pp. 1-27, Feb. 24, 2015.

Shotton, J., et al., "Real-Time Human Pose Recognition in Parts from Single Depth Images", Communications of the ACM, vol. 56, No. 1, Jan. 2013.

Dutton, R.D., et al., "Efficiently Identifying the Faces of a Solid", Computers and Graphics, Elsevier, GB, 7:2, 143-147, 1983.

Kuo, M.H. "Automatic extraction of quadric surfaces from wireframe models" , Computers & Graphics, 25:1, Feb. 2001 (Feb. 2001).

Hanrahan, P.: "Creating vol. Models from Edge-Vertex Graphs", Proceedings of the 9th Annual Conference on Computer Graphics and Interactive Techniques , SIGGRAPH '82, vol. 16, 1982, pp. 77-84.

Inoue, K., et al. "Solid Model Reconstruction of Wireframe Cad Models Based on Topological Embeddings of Planar Sraphs", 2003. European Search Report and Written Opinion for EP 13 30 5751 dated Oct. 28, 2013.

Alj, Y. et al., "Multi-Texturing 3D Models: How to Choose the Best Texture?", IC3D Beljium (2012), hal-00785836, Version 1, 8 pages (Feb. 7, 2013).

Allène, C. et al., "Seamless Image-Based Texture Atlases using Multi-band Blending", 4 pages.

Azariadis, P.N. et al., "Drawing curves onto a cloud of points for point-based modelling," Computer-Aided Design, 37(1): 109-122 (Jan. 1, 2005).

Baumberg, A. "Blending images for texturing 3D models", BMVC 2002, 404-413 (2002).

Bernardini, F. et al., "High-Quality Texture Reconstruction from Multiple Scans", 14 pages.

(56) References Cited

OTHER PUBLICATIONS

Callieri, M. et al., "Masked Photo Blending: mapping dense photographic dataset on high-resolution sampled 3D models", (Jan. 8, 2008).
Canny, J. "A Computational Approach to Edge Detection", IEEE Transactions on Pattern Analysis and Machine Intelligence, PAMI-8(6): 679-698 (Nov. 1986).
Carr, N. A. and Hart, J.C., "Meshed Atlases for Real-Time Procedural Solid Texturing", ACM Transactions on Graphics, 21(2): 26 pages (Apr. 2002).
Clark, X.B. et al., "An Investigation into Graph Cut Parameter Optimization for Image-Fusion Applications", IVCNZ '12, Dunedin, New Zealand, 6 pages (Nov. 26-28, 2012).
Colburn, A., et al., "Image-Based Remodeling", IEEE Transactions on Visualization and Computer Graphics, 13 pages (2012).
Cui, Y. et al., "3D Shape Scanning with a Time-of-Flight Camera", 8 pages (2010).
Debevec, P.E. et al., "Modeling and Rendering Architecture from Photographs: A hybrid geometry-and image-based approach", Presented at Computer Graphics Proceedings, Annual Conference Series, New Orleans, Louisiana, pp. 11-20 (Aug. 4-9, 1996).
Dellepiane, M. et al., "Flow-based local optimization for image-to-geometry projection", IEEE Transactions on Visualization and Computer Graphics, pp. 1-12.
Eisemann, M. et al., "Floating Textures", Eurographics, 27(2): 10 pages (2008).
European Search Report for European Application No. EP13306576 entitled "Computing Camera Parameters", completed Mar. 26, 2014.
Fabbri, R. et al., "3D Curve Sketch: Flexible Curve-Based Stereo Reconstruction and Calibration," 2010 IEEE Conference on Computer Vision and Pattern Recognition (CVPR), Jun. 13-18, 2010, San Fancsico, CA, USA, pp. 1538-1545.
Goldlücke, B. and Cremers, D., "A Superresolution Framework for High-Accuracy Multiview Reconstruction", 10 pages.
Hale, J.G. "Texture re-mapping for decimated polygonal meshes", University of Edinburgh, pp. 1-12.
Hanusch, T., "A New Texture Mapping Algorithm for Photorealistic Reconstruction of 3D Objects", The International Archives of the Photogrammetry, Remote Sensing and Spacial Information Sciences, Beijing, vol. XXXVII (Part B5): 699-706 (2008).
Ishikawa, H., "Higher-Order Clique Reduction in Binary Graph Cut", IEEE, pp. 2993-3000 (2009).
Jian-dong, Z. et al., "3D curve structure reconstruction from a sparse set of unordered images," Computers in Industry, 60(2): 126-134 (Feb. 1, 2009).
Kappes, J.H. et al., "A Comparative Study of Modern Inference Techniques for Discrete Energy Minimization Problems", 8 pages.
Kurazume, R., et al., "Simultaneous 2D images and 3D geometric model registration for texture mapping utilizing reflectance attribute", Presented at The 5th Asian Conference on Computer Vision, Melbourne, Australia, pp. 1-8 (Jan. 23-25, 2002).
Larue, F. et al., "Automatic Texturing without Illumination Artifacts from In-hand Scanning Data Flow", Artifacts Free Automatic Texturing for In-hand Scanning, pp. 1-13.
Lempitsky, V. and Ivanov, D., "Seamless Mosaicing of Image-Based Texture Maps", 6 pages.
Lensch, H.P.A. et al., "Automated Texture Registration and Stitching for Real World Models", 13 pages.
Lévy, B. et al., "Least Squares Conformal Maps for Automatic Texture Atlas Generation", 10 pages.
Lourakis, M.I.A. and Argyros, A.A., "SBA: A Software Package for Generic Sparse Bundle Adjustment", ACM Transactions on Mathematical Software, 36(1): pp. 2:1-2:30 (Mar. 2009).
Moslah, O. et al., "Geo-Referencing Uncalibrated Photographs using Aerial Images and 3D Urban Models", 6 pages (Jan. 1, 2009).
Moslah, O. et al., "Urban Models Texturing from Un-Calibrated Photographs", IVCNZ, 23rd International Conference, IEEE, Piscataway, NJ pp. 1-6 (Nov. 26, 2008).
Newcombe, R.A., et al., "KinectFusion: Real-Time Dense Surface Mapping and Tracking*" 10 pages.
Reisner-Kollmann, I. et al., "Interactive reconstruction of industrial sites using parametric models," Proceedings of the 26th Spring Conference on Computer Graphics, SCCG '10, Jan. 1, 2010, p. 101.
Rocchini, C., et al., "Multiple Textures Stitching and Blending on 3D Objects", Istituto di Elaborazione dell'Informazione, 13 pages.
Štencel, M. and Janáček, J., "On Calculation of Chamfer Distance and Lipschitz Covers In Digital Images", 6 pages.
Surazhsky, T. et al., "A Comparison of Gaussian and Mean Curvatures Estimation Methods on Triangular Meshes", 6 pages.
van den Hengel, A. et al., "VideoTrace: Rapid interactive scene modelling from video," ACM Transactions on Graphics, 26(3): 86-1-86-5 (Jul. 29, 2007).
Varady, T. et al, "Reverse Engineering of Geometric Models—An Introduction," Computer-Aided Design, 29(4): 255-268 (Apr. 1, 1997).
Wang, L. et al., "Optimal Texture Map Reconstruction from Multiple Views", 8 pages.
Wu, H. et al., "Photogrammetric reconstruction of free-form objects with curvilinear structures," Visual Comput, 21(2): 203-216 (May 1, 2005).
Zhang, E. et al., "Feature-Based Surface Parameterization and Texture Mapping", ACM Transactions on Graphics, 24(1): 1-27 (Jan. 2005).
Zhang, Z., "A Flexible New Technique for Camera Calibration", Microsoft Corporation, Technical Report MSR-TR-98-71, 22 pages (Dec. 2, 1998).
Zhou, K. et al., "TextureMontage: Seamless Texturing of Arbitrary Surfaces From Multiple Images", 8 pages.
Chen, T., et al, "3-Sweep: Extracting Editable Objects from a Single Photo," SIGGRAPH ASIA, 2013.
Autodesk 123D Catch; "123D Catch is a free app that lets you create 3D scans of virtually any object" www.123dapp.com/catch ; retrieved from Internet Jan. 14, 2016.
Wu, C., "VisualSFM: A Visual Structure from Motion System" http://homes.cs.washington.edu/~ccwu/vsfm/ ; retrieved from Internet Jan. 14, 2016.
Acute3D Capturing Reality; "Capturing reality with automatic 3D photogrammetry software" http://www.acute3d.com, retrieved from Internet Jan. 8, 2016.
Alexandre, L.A., "3D Descriptors for Object and Category Recognition: a Comparative Evaluation," IROS 2012.
Anguelov, D., et al., "Scape: Shape Completion and Animation of People," SIGGRAPH 2005.
Barbic, J., and James, D.L., "Real-Time Subspace Integration for St. Venant-Kirchhoff Deformable Models," SIGGRAPH 2005.
Barron, et al., "Shape, Illumination and Reflectance from Shading," EECS, 2013.
Calakli, F., and Taubin, G., "SSD: Smooth Signed Distance Surface Reconstruction," Pacific Graphics 2011.
Chen, Y., and Cipolla, R., "Single and Sparse View 3D Reconstruction by Learning Shape Priors," CVIU Journal 2011.
Cui, Y., et al., "3D Shape Scanning with a Time-of-Flight Camera," CVPR 2010.
Duncan, K., et al., "Multi-scale Superquadric Fitting for Efficient Shape and Pose Recovery of Unknown Objects," ICRA 2013.
Eitel, A., et al., "Multimodal Deep Learning for Robust RGB-D Object Recognition," International Conference on Intelligent Robots and Systems, 2015.
Eitz, M., et al., "Sketch-Based Shape Retrieval," SIGGRAPH, 2012.
Engel, J., et al., "LSD-SLAM: Large-Scale Direct Monocular SLAM," CVPR2014.
Faugeras, O., "Three-Dimensional Computer Vision: A Geometric viewpoint," MIT Press 1994.
Frefeld, O. and Black, M.J., "Lie Bodies: A Manifold Representation of 3D Human Shape," ECCV 2012.
Furukawa, Y., et al. "Towards Internet-scale Multi-view Stereo," CVPR 2010.
Hartley, R., and Zisserman, A., "Multiple View Geometry in Computer Vision," Cambridge Univ. Press 2004.

(56) References Cited

OTHER PUBLICATIONS

Hildebrandt, K., et al., "Eigenmodes of Surface Energies for Shape Analysis," Advances in Geometric Modeling and Processing 2012.
Newcombe, et al. "KinectFusion: Real-Time Dense Surface Mapping and Tracking," Symposium ISMAR 2011.
Kazhdan, M., et al. "Poisson Surface Reconstruction," Eurographics Symposium on Geometry Processing 2006.
Koutsourakis, P., et al., "Single View Reconstruction Using Shape Grammars for Urban Environments," ICCV 2009.
Li, Y., et al., "Database-Assisted Object Retrieval for Real-Time 3D Reconstruction," Eurographics, 2015.
Mairal, J. "Sparse Modeling for Image and Vision Processing, Foundations and Trends in Computer Graphics and Vision," 2014.
Nelder, J., and Mead, R., "A Simplex Method for Function Minimization," Computer Journal 1965.
Newcombe, R., et al., "Live Dense Reconstruction with a Single Moving Camera," IEEE ICCV2011.
Prados, et al., "Shape from Shading ," Handbook of Mathematical Models in Computer Vision, 2006.
"Reconstruct your world with ReconstructMe", reconstructme.net; retrieved from Internet Jan. 14, 2016.
Rother, C., et al., "GrabCut—Interactive Foreground Extraction using Iterated Graph Cuts," SIGGRAPH 2004.
Rusu, R.B., et al., "Fast Point Feature Histograms (FPFH) for 3D Registration," ICRA 2009.
SDK for Kinect, KinectFusion, http://www.microsoft.com retreived from Internet Jan. 14, 2016.
Sifakis, E.D., "FEM Simulation of 3D Deformable Solids: A Practitioner's Guide to Theory, Discretization and Model Reduction," SIGGRAPH 2012 Course.
Szeliski, R., "Computer Vision: Algorithms and Applications," Edition Springer 2010.
Oswald, M., et al., "Fast and Globally Optimal Single View Reconstruction of Curved Objects," CVPR, 2012.
Tombari, T., et al., "Unique Signatures of Histograms for local Surface Description," ECCV 2010.
Wohlhart, P., and Lepetit, V., "Learning Descriptors for Object Recognition and 3D Pose Estimation," Computer Vision and Pattern Recognition, 2015.
Zheng, et al., "Interactive Images: Cuboid Proxies for Smart Image Segmentation," SIGGRAPH, 2012.
Dutagaci, H., et al. "Evaluation of 3D interest detection techniques via human-generated ground truth" Vis Compt 28:901-917; Jun. 29, 2012.
Technion, Michael K., "On Edge Detection on Surfaces", IEEE, 2009.
European Search Report for EP 16 30 6838 dated Jul. 20, 2017.
Sahu, T., et al. , "Image Enhancement Based on Abstraction and Neural Network", International Journal of Scientific Engineering and Technology, pp. 2277-1581148. Apr. 2012.
Landau, M., et al., "Simulating Kinect Infrared and Depth Images", IEEE Transactions of Cybernetics, vol. 46, No. 12, pp. 3018-3031; Nov. 13, 2015.
Ley, A., et al., SyB3R: A Realistic Synthetic Benchmark for 3D Reconstruction from Images, Network and Parallel Computing, pp. 23-251, Sep. 16, 2016.
Komodakis, N., et al. . "MRF optimization via dual decomposition: Message-passing revisited." Computer Vision, IEEE 11th International Conference 2007.
Sculpteo, "MeshMixer Tutorial Part1: Modeling for 3D Printing", https://youtube.com/watch?v=WwIM4FP2SgA, retrieved from Internet Sep. 13, 2017.
Salamati, N., et al. "Incorporating Near-Infrared Information into Semantic Image Segmentation", CORR, Jun. 24, 2014.
Krahenbuhl, P., et al. "Efficient Inference in Fully Connected CRFs with Gaussian Edge Potentials" Computer Science Department, Stanford University, May 12, 2017.
Hoegner, L., et al. "Towards People Detection from Fused Time-of-Flight and Thermal Infrared Images" International Archives of the Photogrammetry, Remote Sensing and Spatial Information Sciences, vol. Xl-3, Aug. 11, 2014.
European Search Report for EP 16 30 6860 dated May 19, 2017.

* cited by examiner

DESIGNING A 3D MODELED OBJECT WITH 2D VIEWS

RELATED APPLICATION

This application claims priority under 35 U.S.C. § 119 or 365 to European, Application No. 13305751.3, filed Jun. 4, 2013. The entire teachings of the above application(s) are incorporated herein by reference.

FIELD OF THE INVENTION

The invention relates to the field of computer programs and systems, and more specifically to a method, system and program for designing a three-dimensional modeled (3D) modeled object, as well as a 3D modeled object obtainable by said method and a data file storing said 3D modeled object.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Some CAD systems now allow the user to design a 3D modeled object based on a set of two-dimensional (2D) pictures, for example photos, of a real object that is to be modeled. Existing methods include providing to the system several overlapping pictures representing the real object from different angles. Then, the user is involved to match up identical points, lines and edges across the pictures. Optionally, the user adds curves on pictures, while maintaining the overlapping coherence. The next step is for the system to automatically compute a 3D version of the object. The geometry of this object is a set of 3D points, curves and lines representing characteristic edges. It may be wireframe geometry. Optionally, the user adds 3D curves on this wireframe geometry. The user is involved again to create surfaces bounded by the curves computed at previous steps. Boundary curves of each surface are selected by the user. Depending on the application, a wireframe model, a surface model or even a solid model might be created from the initial pictures, although this is not perfectly clear from prior art literature.

As can be seen, this prior art involves the user during two steps. The first step is to set up the matching across overlapping pictures. This step seems to be unavoidable. After the system has created 3D curves, the other step is for the user to select boundary curves in order for the system to create surfaces. This manual selection is required because the systems of the prior art are unable to automatically create surfaces from 3D curves. This manual process can be very long and tedious from the user point of view. Furthermore, an incorrect selection results in twisted or overlapping surfaces. Identifying and repairing these pathological surfaces is the user's responsibility, which lengthens again the path to the virtual 3D object.

Thus, the invention aims at improving the design of 3D modeled objects based on 2D views.

SUMMARY OF THE INVENTION

According to one aspect, it is therefore provided a computer-implemented method for designing a three-dimensional modeled object. The method comprises the step of providing a plurality of two-dimensional views of the modeled object having curves and points defined thereon, a three-dimensional wireframe graph comprising edges that connect vertices, and correspondences between the edges and the vertices with respectively curves and points on the views. The method also comprises the step of associating, to each vertex of the wireframe graph, a local radial order between all the edges incident to the vertex, according to local partial radial orders between the curves corresponding to the edges on each of the views with respect to the point corresponding to the vertex. And then the method comprises the step of determining edge cycles, by browsing the wireframe graph following the local radial orders associated to the vertices.

The method may comprise one or more of the following:
wherein associating, to each vertex of the wireframe graph, a local radial order between all the edges incident to a respective vertex comprises, for each respective vertex, determining, for each view, the local partial radial order with respect to the point corresponding to the respective vertex between curves that are defined on the view and that correspond to an edge incident to the respective vertex, merging all the local partial radial orders, and traversing the result of the merging of all the local partial radial orders to detect a cycle including all the edges incident to the respective vertex, said cycle constituting the local radial order associated to the respective vertex;
the local partial radial orders are determined as graphs of which nodes identify edges and of which arcs identify subsequence between edges;
associating, to each vertex of the wireframe graph, a local radial order between all the edges incident to a respective vertex further comprises, when traversing the result of the merging of all the local partial radial orders leads to detecting several cycles including all the edges incident to the respective vertex, selecting one of the cycles detected for said respective vertex, said respective vertex being a singular vertex;
selecting one of the cycles detected comprises performing a regularization process on the set of all singular vertices, the regularization process comprising choosing a starting singular vertex and a starting output edge of said starting singular vertex, browsing the wireframe graph following the local radial orders associated to the vertices to detect an edge cycle at said starting singular vertex, and then, if reaching another singular vertex, repeating the regularization process with a new starting singular vertex and/or a new starting output edge, else, associating to said starting singular vertex the cycle, detected when traversing the result of the merging of all the local partial radial orders leads, that is compliant with the order between the starting output edge and the final edge browsed, removing the starting singular vertex from the set of all singular vertices, and then repeating the regularization process until no singular vertex remains;

determining edge cycles by browsing the wireframe graph comprises the sub-steps of choosing a vertex, forming an edge list by following, starting from the chosen vertex, the local radial orders associated to the vertices as they are encountered, and incrementing the edge list with the followed edges, until the edge list forms an edge cycle, and repeating the preceding sub-steps;

the views are images and the wireframe graph is a three-dimensional construction of the modeled object based on the images;

the method further comprises, prior to providing the views, the wireframe graph, and the correspondences, capturing images of a same physical product, defining curves and points on the images, thereby forming the views, defining correspondences between the curves and points of each image with respectively curves and points on the other images, and constructing the wireframe graph based on the views and on the correspondences, the wireframe graph thereby constructed comprising edges that connect vertices, and correspondences between the edges and the vertices with respectively curves and points on the views;

the images are photos; and/or the method further comprises fitting the wireframe graph with surfaces based on the determined edge cycles.

It is further proposed a three-dimensional modeled object obtainable by the above method.

It is further proposed a data file storing said three-dimensional object.

It is further proposed a computer program comprising instructions for performing the above method. The computer program is adapted to be recorded on a computer readable storage medium.

It is further proposed a computer readable storage medium having recorded thereon the above computer program.

It is further proposed a CAD system comprising a processor coupled to a memory and a graphical user interface, the memory having recorded thereon the above computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
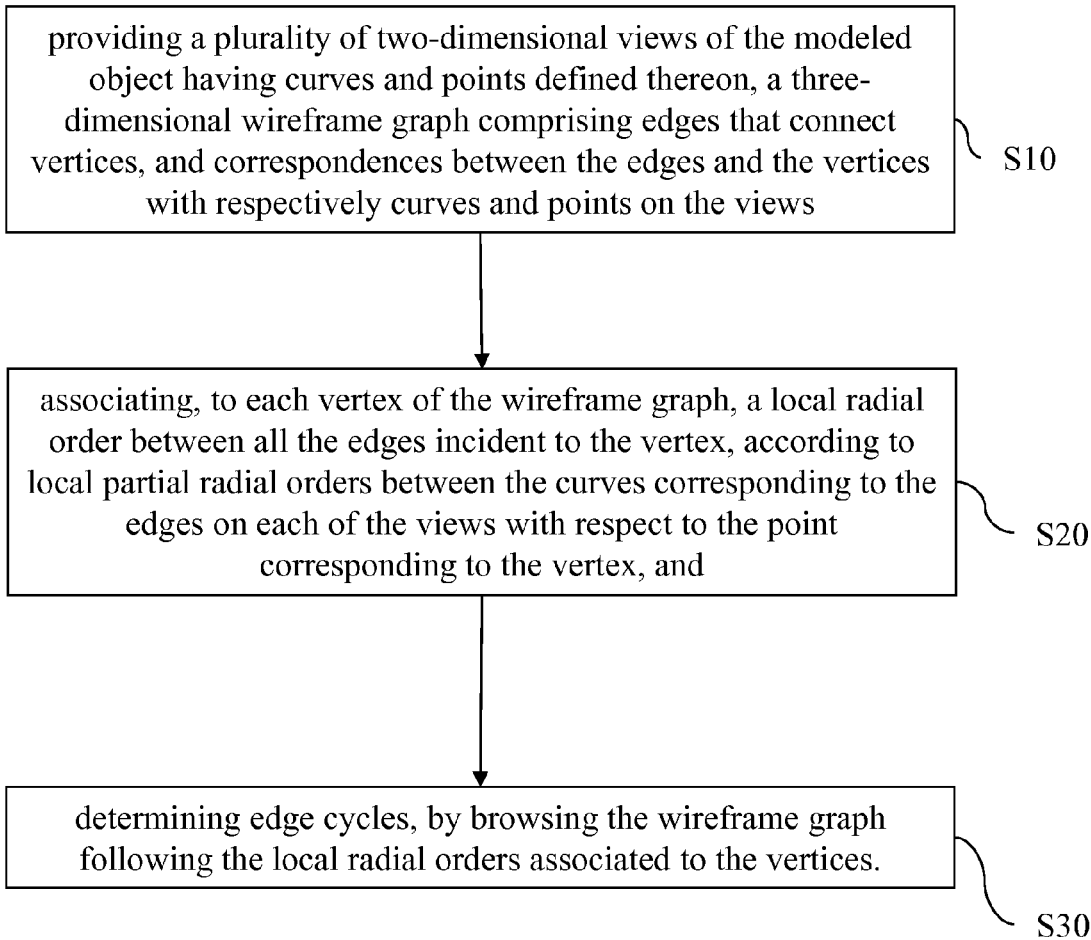
FIG. 1 shows a flowchart of an example of the method.

FIG. 1 shows a flowchart of an example of computer-implemented method for designing a 3D modeled object.

The method comprises the step of providing S10 a plurality of 2D views of the modeled object. The views have curves and points defined thereon. The method also provides at S10 a 3D wireframe graph. The 3D wireframe graph comprises edges that connect vertices, and correspondences between the edges and the vertices with respectively curves and points on the views. The method also comprises associating S20, to each vertex of the wireframe graph, a local radial order between all the edges incident to the vertex. The associating S20 is performed according to local partial radial orders between the curves corresponding to the edges on each of the views with respect to the point corresponding to the vertex. Then the method comprises determining S30 edge cycles. The determining S30 is performed by browsing the wireframe graph following the local radial orders associated at S20 to the vertices. This improves the design of a 3D modeled object based on 2D views of the modeled object.

As explained earlier, the background art considers the provision of a 3D wireframe graph corresponding to 2D views of a 3D modeled object to be designed. However, the user then has to fit the wireframe graph with surfaces manually, which is both difficult and may be ambiguous in some cases. The method allows a robust automation of the process as it leads to the determination at S30 of edge cycles on the 3D wireframe graph. As known in the art, such a 3D wireframe graph with edge cycles defined on it may lead to design a surface, by fitting the wireframe graph with surfaces based on the determined edge cycles. The method may do that according to any known technique, which is not the subject of the present discussion.

Figure 2:
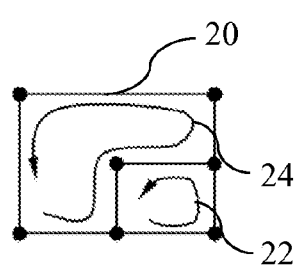
FIGS. 2-3 illustrate an issue related to the determination of edge cycles.
Figure 3:
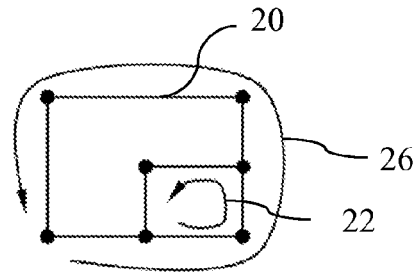

Investigating an algorithm to automate the surfaces creation from the 3D curves network may thus lead to the problem of finding an appropriate set of edge cycles, each edge cycle defining the boundary of a surface as a closed loop of curves. Existing algorithms in this field are either combinatorial algorithms or topological algorithms. A combinatorial algorithm actually computes a basis of cycles, typically a basis of fundamental cycles. In order to avoid surfaces overlapping, a basis of minimum cycles is advantageous. Unfortunately, this computation is impractical for the following reasons. The algorithmic complexity is polynomial and the basis of minimum cycles is not unique, which may lead again to overlapping surfaces, as illustrated by FIGS. 2-3, which show two different pairs of edge cycles (22 and 24) or (22 and 26) for the same wireframe graph 20. On the other hand, topological algorithms require spatial hypotheses on the 3D curve network (mainly the network is "almost" planar) that are not realistic in the industrial context.

The method avoids these issues by sorting edges around each vertex in the appropriate order (the local radial orders involved at the associating S20). This local sorting is computed by reusing the input 2D views provided at S10, as each local radial order is according to local partial radial orders between the curves on each of the views. Traversing the whole 3D curves network according to the local sorting at the determining S30 eventually provides a set of edge cycles. Each edge cycle is a closed loop of curves and defines the boundary of a surface. Furthermore, since cycles' adjacencies are known, tangency constraints may be further handled by the method in order to compute tangent resulting surfaces for the fitting mentioned above.

The method eliminates the need for manual selection of boundaries for surfaces creation. This shortens the time to get the virtual 3D object in the CAD system, and thus improves productivity. Furthermore, the skin resulting from the method is guaranteed to be a closed and oriented skin, which in turn improves quality and, again, shortens time since a posteriori checking is no longer necessary. When dealing with standard input objects, the algorithmic complexity of the method is linear, and this is the optimum. Consequently, implementing the method provides the best possible performance to the CAD system.

A modeled object is any object defined/described by structured data that may be stored in a data file (i.e. a piece of computer data having a specific format) and/or on a memory of a computer system. By extension, the expression "modeled object" may designate the data itself. The modeled object obtained by the method has a specific structure, as it has in the data defining it the wireframe graph with the edge cycles determined at S30. Moreover, the modeled object may also comprise the local radial orders and/or the local partial orders involved at S20, although the method may comprise deleting any or both of said local orders once the edge cycles are determined at S30.

The method is for designing the 3D modeled object, e.g. the steps of the method constituting at least some steps of such design. "Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The 3D modeled object may be a CAD modeled object or a part of a CAD modeled object. In any case, the 3D modeled object designed by the method may represent the CAD modeled object or at least part of it, e.g. a 3D space occupied by the CAD modeled object. A CAD modeled object is any object defined by data stored in a memory of a CAD system. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space).

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process. The method can be implemented using a CAM system, such as DELMIA. A CAM system is any system suitable at least for defining, simulating and controlling manufacturing processes and operations.

The method is computer-implemented. This means that the method is executed on at least one computer, or any system alike. For example, the method may be implemented on a CAD system. Thus, steps of the method are performed by the computer, possibly fully automatically, or, semi-automatically (e.g. steps which are triggered by the user and/or steps which involve user-interaction). Notably, the providing S10 may be triggered by the user. Other steps of the method may be performed automatically (i.e. without any user intervention), or semi-automatically (i.e. involving, e.g. light, user-intervention, for example for validating results).

A typical example of computer-implementation of the method is to perform the method with a system suitable for this purpose. The system may comprise a memory having recorded thereon instructions for performing the method. In other words, software is already ready on the memory for immediate use. The system is thus suitable for performing the method without installing any other software. Such a system may also comprise at least one processor coupled with the memory for executing the instructions. In other words, the system comprises instructions coded on a memory coupled to the processor, the instructions providing means for performing the method. Such a system is an efficient tool for designing a 3D modeled object.

Such a system may be a CAD system. The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The system may comprise at least one GUI for launching execution of the instructions, for example by the user. Notably, the GUI may allow the user to trigger the step of providing S10, and then, if the user decides to do so, e.g. by launching a specific function, to trigger the rest of the method.

The 3D modeled object is 3D (i.e. three-dimensional). This means that the modeled object is defined by data allowing its 3D representation. Notably, the wireframe graph is 3D (i.e. the wireframe graph may be non-planar). A 3D representation allows the viewing of the representation from all angles. For example, the modeled object, when 3D represented, may be handled and turned around any of its axes, or around any axis in the screen on which the representation is displayed. This notably excludes 2D icons, which are not 3D modeled, even when they represent something in a 2D perspective. The display of a 3D representation facilitates design (i.e. increases the speed at which designers statistically accomplish their task). This speeds up the manufacturing process in the industry, as the design of the products is part of the manufacturing process.

Figure 4:
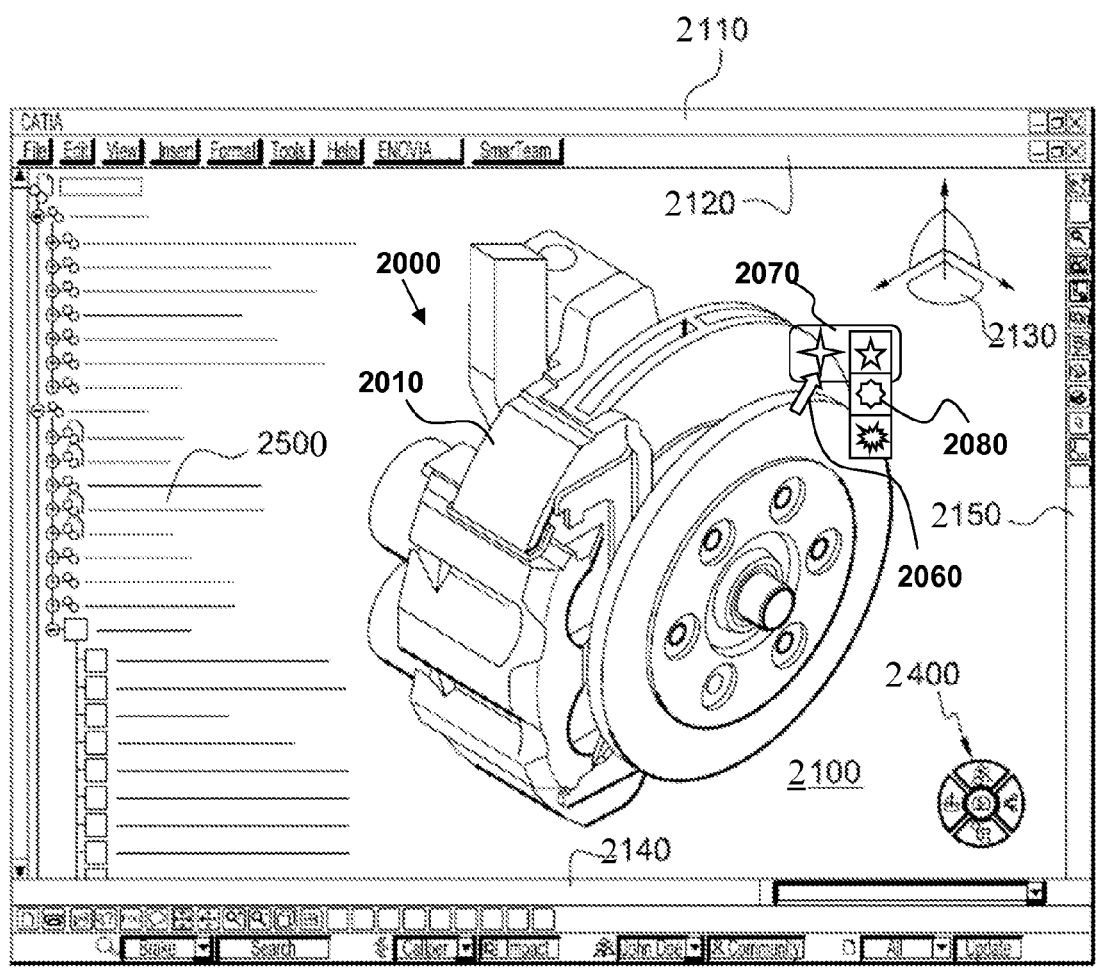
FIG. 4 shows an example of a graphical user interface.

FIG. 4 shows an example of the GUI of a typical CAD system.

The GUI 2100 may be a typical CAD-like interface, having standard menu bars 2110, 2120, as well as bottom and side toolbars 2140, 2150. Such menu and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. a sculpting operation, or any other operation such as a change of dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 4, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or rendering various attributes of the displayed product 2000. A cursor 2060 may be controlled by a haptic device to allow the user to interact with the graphic tools.

Figure 5:
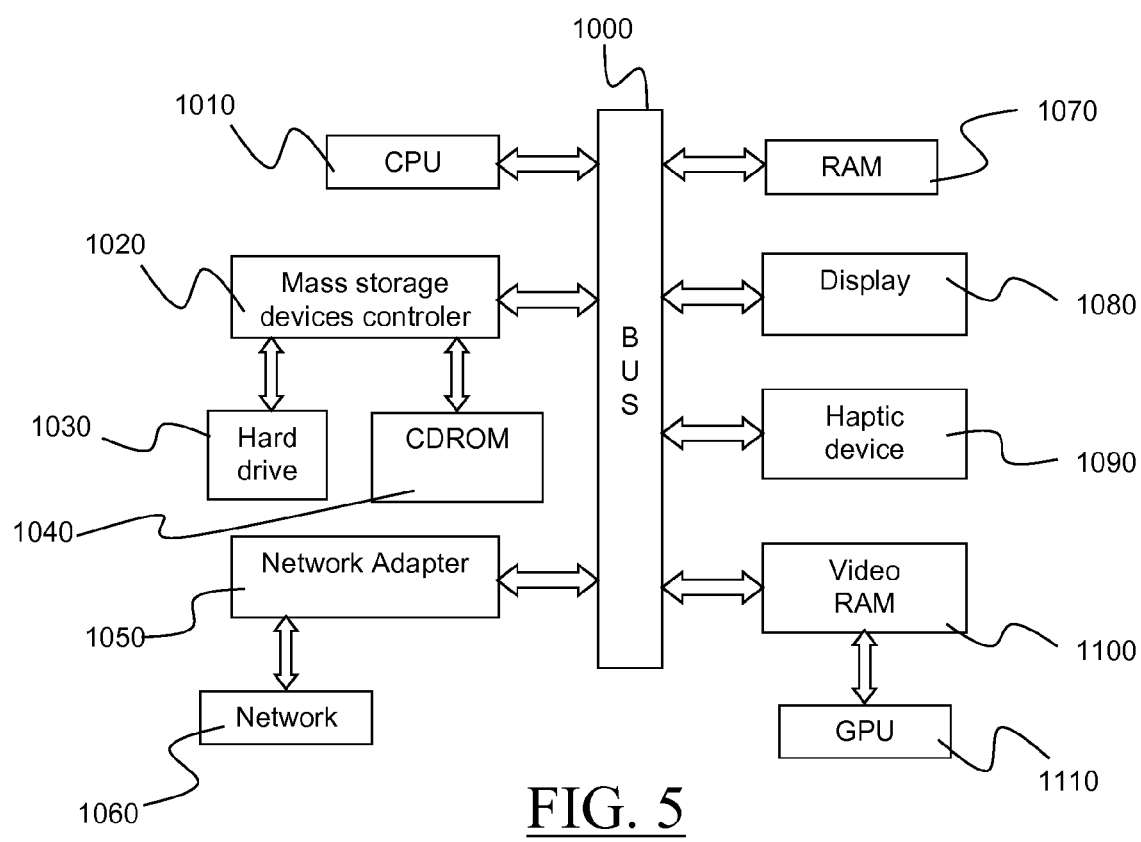
FIG. 5 shows an example of a client computer system.

FIG. 5 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphics processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks, magneto-optical disks, and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as a cursor control device, a keyboard or the like. A cursor control device is used in the client computer to permit the user to selectively position a cursor at any desired location on screen 1080, as mentioned with reference to FIG. 4. By screen, it is meant any support on which displaying may be performed, such as a computer monitor. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

As explained earlier, the method of FIG. 1 is for designing a 3D modeled object starting from the plurality of 2D views of the modeled object and the corresponding 3D wireframe graph by determining at S30 the edge cycles. As explained earlier, the edge cycles may then be used, among other possible actions known in the field, for fitting the wireframe graph with surfaces based on them, according to any known method. Notably, the surfaces may form a boundary representation (B-Rep), e.g. under the specific format of B-Reps described in European patent application No. 12306720.9 which is incorporated herein by reference. The method may determine at S30 one edge cycle per tile of the wireframe graph (referred to as "minimum edge cycle" in the following), such that the whole set of edge cycles eventually covers the whole wireframe graph, with no overlapping.

The views that are provided at S10 are any 2D representations of the 3D modeled object that is under design. The views may be images. The method may notably, prior to the providing S10, capture several images of a same single physical product that may constitute the views, potentially including some modifications/additions on the images, as explained below. This may be done for example by a camera capturing photos. For example, a same physical product may be photographed from different angles, the resulting photos thus representing the product under different perspectives. In an example, the outer surface of the physical product is integrally represented through the plurality of views. The method may in such a case reconstruct, or build, a comprehensive 3D design of the physical product (or in general any object represented by the views), i.e. the 3D modeled object, based on smaller information (2D views) that are however multiple.

The first step toward this is to consider a 3D wireframe graph that corresponds to the plurality of 2D views in a way explained later. The 3D wireframe graph may be provided at S10 already prepared as such, or it may be constructed in a prior step by the method according to any known technique, e.g. based on the 2D views.

For example, in the case the method comprises capturing images, e.g. photos, of a same physical product, the method may comprise defining curves and points on the images to form the views. In other words, the views are data including a standard image with 2D curves and 2D points defined thereon. The curves and points may be defined, in any known way, according to the images and the lines and corners of the physical product as they appear on the images. The user may be involved in such a step, as explained earlier. Known automatic algorithms may also be used. Then, the method comprises defining correspondences (in the case of a computer-implemented method, correspondences are pieces of data that associate two pieces of data, such as links or pointers) between the curves and points of each image with respectively curves and points on the other images. Basically, curves and points of different images that represent the same lines and corners of the physical product are put into correspondence, precisely so as to highlight such information. This may be performed according to any know method. The user may be involved in such a step, as explained earlier. Known automatic algorithms may also be used.

Finally, before the providing S10, the method in such an example constructs the 3D wireframe graph based on the views and on the correspondences. The 3D wireframe graph is a graph having a specific structure, according to the method. Notably, the wireframe graph comprises as all graphs edges that connect vertices, and correspondences between the edges and the vertices with respectively curves and points on the views. Furthermore, as known in the field, the edges of the 3D wireframe graph are associated with 3D curves (also referred to as the edges in the following) and the vertices of the 3D wireframe graph are associated to 3D points or positions (also referred to as the vertices in the following). In this sense, with edges that are 3D curves and vertices that are 3D points defining where the curves meet on their ends, the wireframe graph is a three-dimensional modeled object.

The 3D edges and the 3D vertices are determined (when the method comprises constructing the wireframe graph) based on the views and on the correspondences defined earlier. This may be done according to any method known in the art, and this may involve user-interaction and/or known automatic algorithms. Thus, the wireframe graph is a construction of the modeled object that is based on the images, in the sense that different 2D information on the same physical product contained in the images is used to reconstruct a 3D wireframe graph corresponding to the product, as known per se. For a relatively easy execution of these steps, the physical product may be opaque, such that its lines and corners are well defined and such that there is no ambiguity among the different 2D views.

The method also comprises associating S20 (i.e. pieces of data representing such association, e.g. links and/or pointers, are created), to each vertex of the wireframe graph, a local radial order between all the edges incident to the vertex. In other words, for each vertex of the wireframe graph, all edges incident to the vertex are contemplated and an order (local to the vertex) is determined between them and stored. The local order is radial, meaning that it represents the order in which the edges are encountered when rotating around the vertex. For example, the local radial order may radially order the projections of the edges (e.g. a projection of the tangents of the edges at the incident vertex) on a plane containing the incident vertex.

The associating S20 is performed according to local partial radial orders between the curves corresponding to the edges on each of the views with respect to the point corresponding to the vertex. The edges of the wireframe each correspond to a respective curve on at least one of the views. Indeed, according to the perspective applied by a given view, some edges may not be present on it. However, for each edge there is at least one view for which the perspective is such that the view has a curve corresponding to the edge defined thereon. Now, considering the set of edges incident on each contemplated vertex of the associating S20, all the edges are present on at least one of the plurality of views for each of them (via the corresponding 2D curves defined on the views). For each such view, a radial order may be directly defined between said curves, called "local partial radial order", the view being 2D. The associating S20 considers all such local partial radial orders that correspond to the set of edges incident on the contemplated vertex and determines the local radial order between all edges accordingly, in a systematic way (e.g. the method may follow a predetermined algorithm to perform the associating), which allows automation. An example of how to implement this is provided later. Thus, the method uses at S20 the views to determine such local radial orders for all vertices of the wireframe graph, in addition to a potential previous use of the views to determine the wireframe graph. In this sense, the views are efficiently reused for the automation of this part of the process.

Then the method comprises determining S30 edge cycles. The determining S30 is performed by browsing the wireframe graph following the local radial orders associated at S20 to the vertices. In other words, the graph is integrally traversed (i.e. edges are followed until all tiles of the wireframe graph are cycled once) following the local radial orders. Namely, when browsing the wireframe graph, upon arriving at a vertex the local radial order associated at S20 to the vertex is considered to determine which edge to follow next (to go to the next vertex). The method may store the orders in which the edges are thereby followed and define instances of cycles (each time the browsing leads to a vertex already visited). This is illustrated later. The determining S30 is thus executable in a systematic way and may thus lead to a significant automation of the determination of the edge cycles, in a relatively simple manner (in terms of computation and memory resources). Said edge cycles may be used to fit the wireframe graph with surfaces, e.g. a B-Rep, as explained earlier.

An example of the method is now discussed with reference to FIGS. 6-40, FIG. 6 showing a flowchart representing the whole method of the discussed example.

The physical product of the example to model in the CAD system is L-shape solid 60. The internal edge of the "L" is filleted. The user feeds at S05 the CAD system with five 2D pictures (e.g. photos) of this solid (FIGS. 7-11) captured at S05, on which curves and points are defined. Camera positions associated with pictures are also sent to the CAD system in the example.

The next step of the method of the example is for the user to define and match up at S06 and S07 points across overlapping pictures (curves being matched up accordingly). The resulting views are illustrated on FIGS. 12-16 by numerical labels which respectively correspond to the five pictures of FIGS. 7-11. Points are numbered from 1 to 14. Points are tagged with their number on the figures where they are visible.

Figure 17:
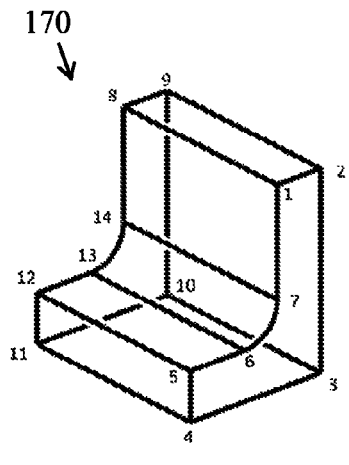

From this information, the CAD system is able to compute at S08 a network of 3D curves (the edges), in other words 3D wireframe graph 170 as illustrated in FIG. 17. The state of the art technology is able to compute this 3D wireframe graph. Each vertex and each edge on the 3D wireframe graph corresponds to a point and curve that are each visible on at least two input pictures. It is indeed advantageous to retrieve the 3D position and shape of an object from more than one 2D view/picture of the said object.

A goal of the method of the example is to eventually compute all minimum edge cycles of this graph at S30, so that the surfaces boundary may potentially be defined according to known algorithms. In the context of the example, a "minimum edge cycle" is defined as follows. When projected on initial pictures, oriented edges of the same minimum cycle correspond to boundary curves of the same 2D face.

By definition, a planar simple loop ("loop" in the following) is a planar closed curve that separates the plane into exactly two portions. The non-bounded portion is named the "outside" of the loop and the bounded portion is named the "inside" of the loop.

By definition, a planar face includes one loop named the "external loop" and a set of loops named "internal loops". The external loop is mandatory while internal loops are not. Loops are arranged according to the following conditions:

All internal loops are included inside the external loop.
No internal loop is included inside another internal loop.

Considering the set of loops as a planar graph and noting L the number of loops, E the number of edges, V the number of vertices and K the number of connected components of the graph, then the following relationship must be satisfied:

$$L=E-V+K.$$

Figure 18:
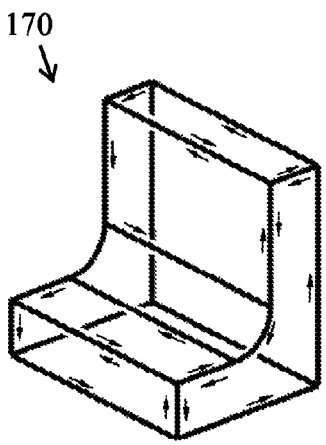
Figure 19:
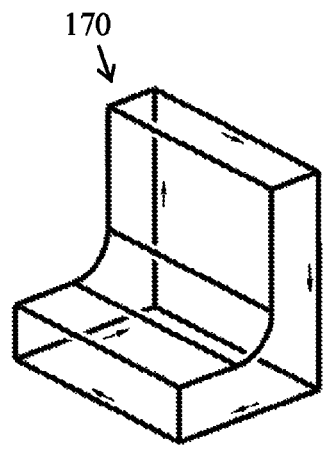

FIG. 18 illustrates five such minimum edge cycles. FIG. 19 illustrates a cycle that is not a minimum cycle: some edges are boundary curves of the bottom face of the L-shape solid while some others are boundary edges of the back face of the L-shape solid.

The method computes all minimum edge cycles through two steps. The first step is to sort edges around each vertex according to an appropriate topological local radial order at S20. The second step is to traverse the 3D graph by using these radial orderings at S30.

When the topological radial order is ambiguous, which may happen in marginal cases, the method of the example provides a strategy ("regularize" step S28 on FIG. 6 discussed later) to overcome the difficulty that is reasonably efficient in industrial situations.

Figure 6:
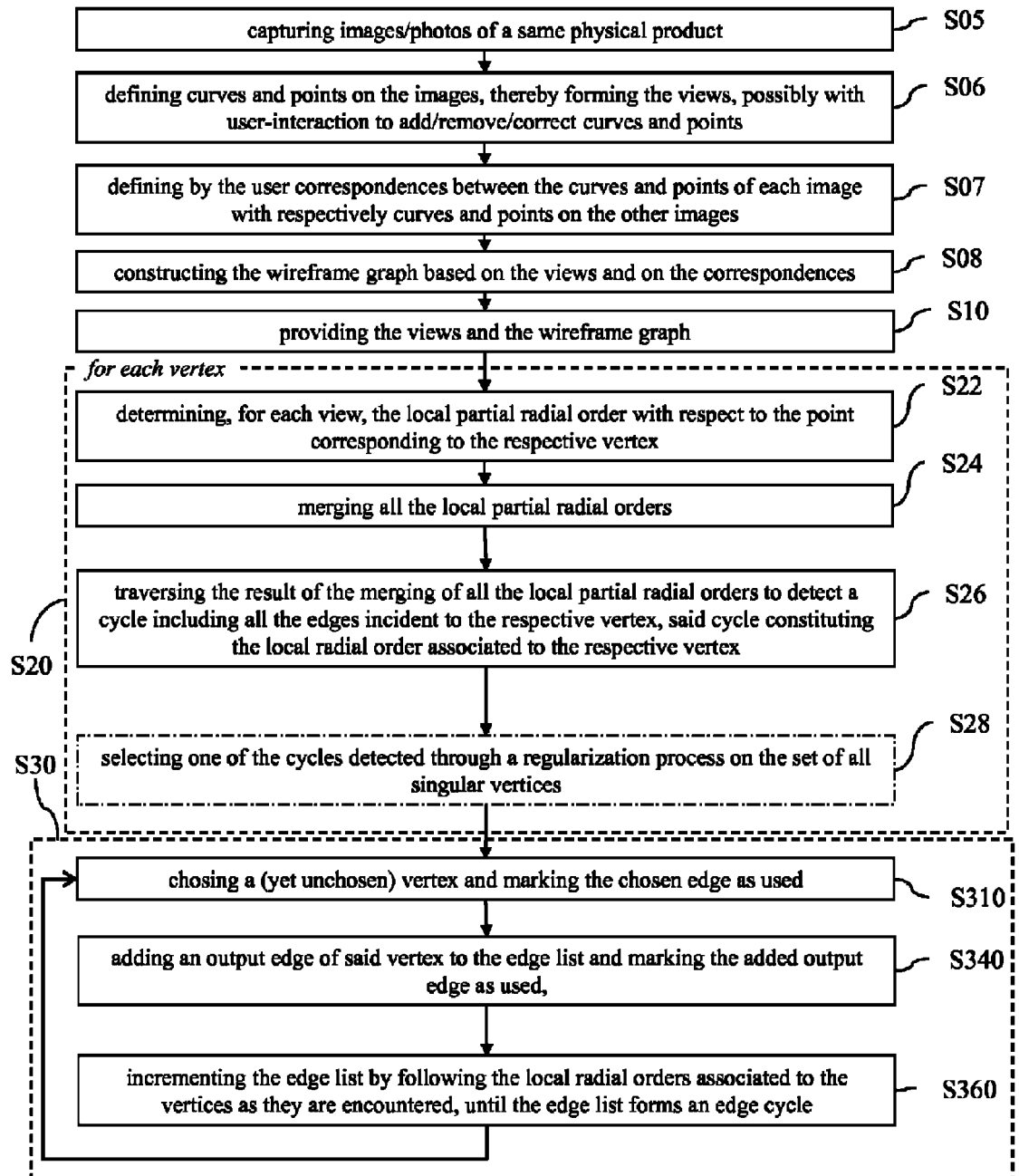
FIGS. 6-40 illustrate examples of the method.
Figure 7:
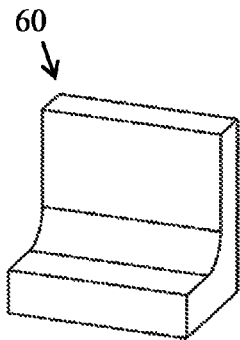
Figure 8:
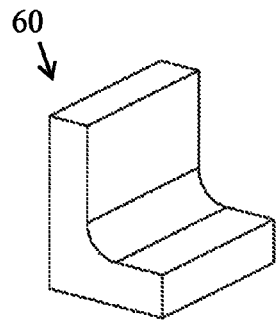
Figure 9:
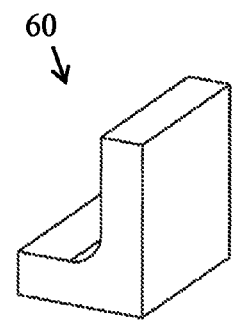
Figure 10:
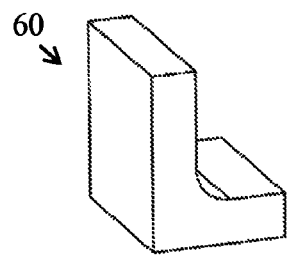
Figure 11:
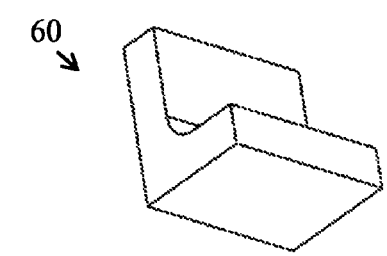
Figure 12:
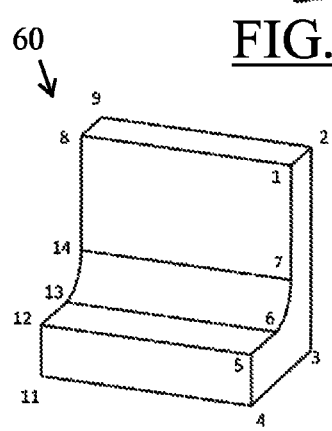
Figure 13:
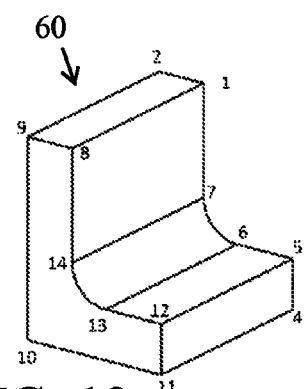
Figure 14:
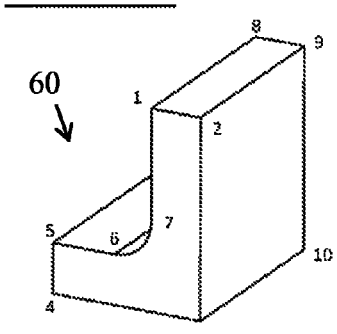
Figure 15:
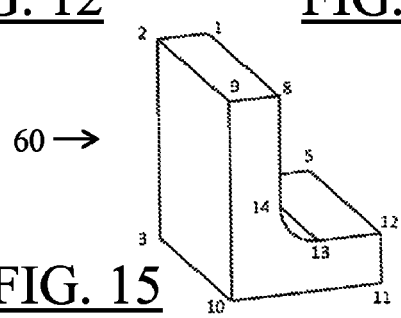
Figure 16:
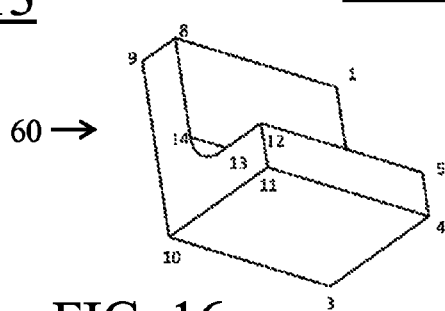

An example of the associating S20 implemented in the method of FIG. 6 is now discussed with reference to FIGS. 6-26.

In this example, the associating S20, to each vertex of the wireframe graph, of a local radial order between all the edges incident to a respective vertex comprises specific actions for each respective vertex that are easily automatable and lead to fairly good results. The associating S20 comprises for each respective vertex determining S22, for each view, the local partial radial order with respect to the point corresponding to the respective vertex between curves that are defined on the view and that correspond to an edge incident to the respective vertex. In other words, the method considers 2D curves on the 2D views that correspond to the edges incident to the respective vertex and determines at S22 radial orders thereof on each view. Then, the method performs a merging S24 of all the local partial radial orders. All the local partial radial orders are thus gathered in one graph. Finally, the method traverses at S26 the result of the merging S24 (edges of the merge graph are followed), to detect a cycle (one or more) including all the edges incident to the respective vertex, said cycle constituting the local radial order associated to the respective vertex. In the example, the local partial radial orders are determined at S22 as graphs of which nodes identify edges and of which arcs identify subsequence between edges (i.e. two edges that are subsequent one to the other on the wireframe graph are linked by an oriented arc on the "local partial order" graphs).

Ordering incident edges of a vertex x is performed through two steps. The first step is to gather at S22 and S24 around vertex x all partial radial orders computed from pictures where it is visible. The second step is to extract at S26 (and possibly S28) from all these partial radial orders a unique local radial order.

Figure 20:
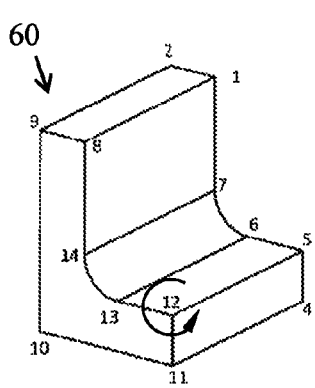

Given a vertex x, the method of the example finds all views where it is visible. For each such view, the method gets the visible edges incident to x, sorts these edges around vertex x in a predetermined order (e.g. CCW: counter clockwise) induced by the planar topology of the picture and stores this partial order in an appropriate data structure. For example, vertex 12 of solid 60 is connected to edges (12,5), (12,11) and (12,13). The view of FIGS. 8 and 13 features vertex 12 together with all its connected edges which, additionally, are visible. According to the planar topology of the view of FIGS. 8 and 13, the CCW radial order is then: ((12,5),(12,13),(12,11)) as illustrated in FIG. 20.

Choosing another picture/view featuring same edges connected to vertex x (picture 4, FIGS. 10 and 15, in the example of vertex 12) yields the same radial order. This is due to the fact that the 3D object from the real world is bounded by an oriented skin. This topological property is captured through the views.

In the L-shape solid example, each vertex is visible together with all its incident edges from at least one picture, which particularly simplifies the radial order computation (because the merging S24 will lead to a uniquely ordered cycle).

This situation does not always occur, and FIGS. 21-26 illustrate a case where the merging S24 and the traversing S26 help combining the information determined at S22.

Figure 21:
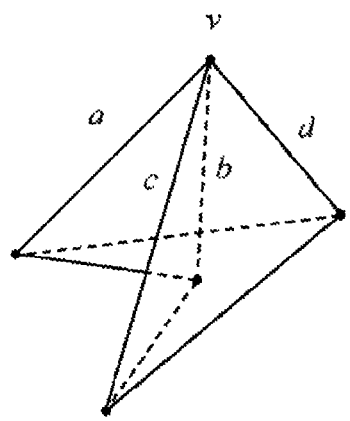
Figure 22:
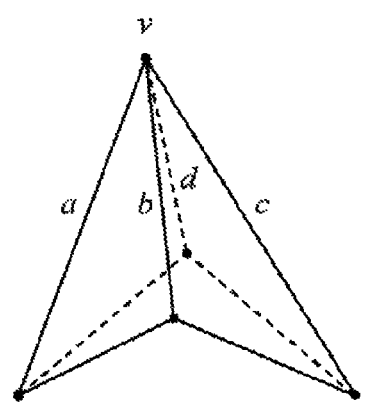

FIGS. 21-22 illustrate two pictures of a pyramidal V-based solid. Edges a,b,c,d are incident to the top vertex v of the pyramid. Dotted lines are invisible edges, they should not appear on the pictures, but they are represented for explanation purpose.

Figure 23:
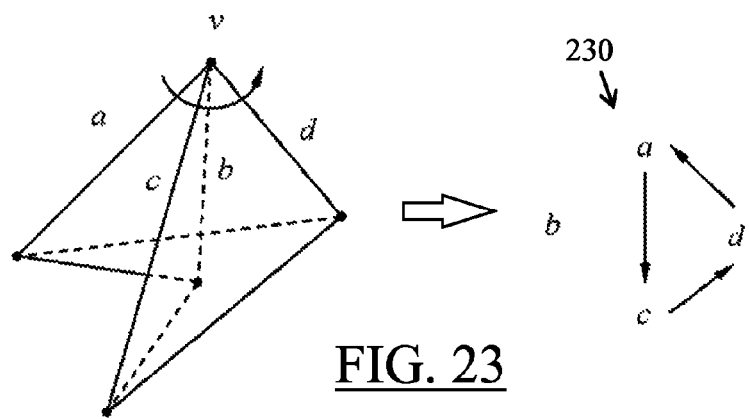

In the picture of FIG. 21, vertex v is visible together with incident edges a,c,d, edge b being hidden. The partial local radial order 230 is then (a,c,d), as illustrated in FIG. 23.

Figure 24:
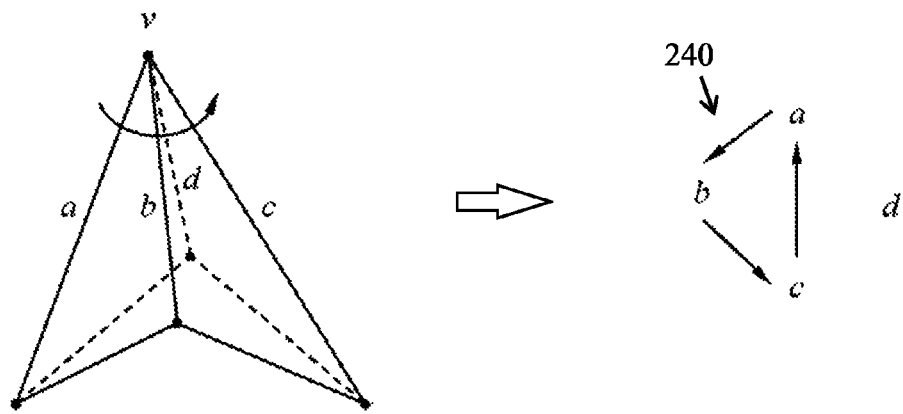
Figure 25:
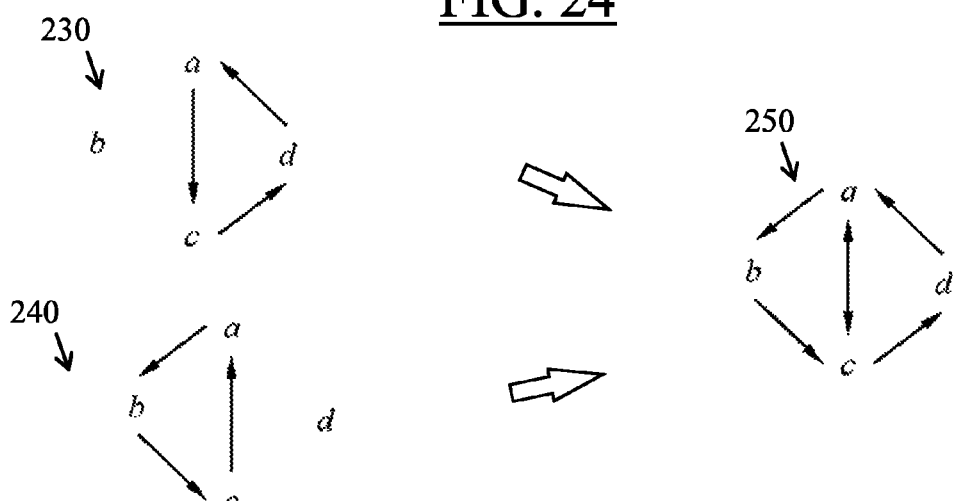

In the picture of FIG. 22, vertex v is visible together with incident edges a,b,c, edge d being hidden. The partial local radial 240 order is then (a,b,c), as illustrated in FIG. 24.

Finally, two local partial radial orders are attached to vertex v: order (a,c,d) and order (a,b,c). It must be noticed that there is no starting point in the order as it could be understood from parentheses notation. These are cyclic lists in the example.

For each vertex, the local radial order is obtained at S20 by combining and analyzing at S26 local partial radial orders. Back to the V-based solid example, vertex v is associated with local partial radial orders (a,c,d) and (a,b,c). The first step is to merge at S26 all local partial radial orders into a single graph 250, as illustrated on FIG. 25. It must be understood that the vertices a, b, c, d of partial radial order graphs are edges of the 3D wireframe graph and that oriented arcs of partial radial order graphs capture partial radial orders around vertex v.

Figure 26:
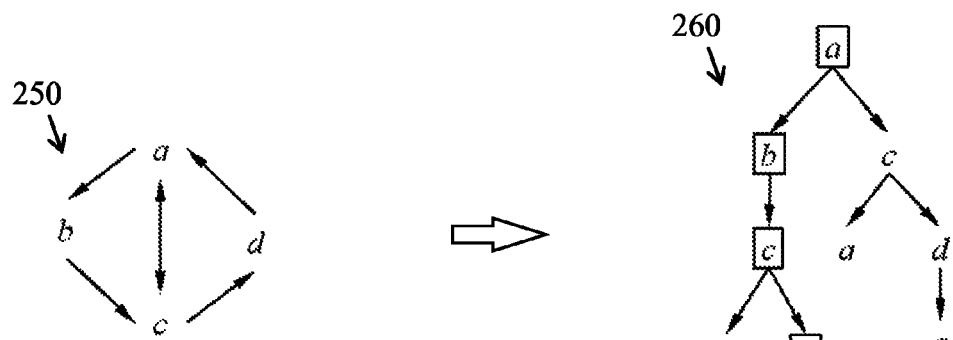

Then, the resulting oriented graph is analyzed to check if it includes a maximum and unique cycle ("maximum" meaning that the cycle includes all nodes). The algorithm is to build the graph traversal starting from an arbitrary node. FIG. 26 illustrates the graph traversal starting from node a, which yields a tree 260 rooted at node a. Classically, graph traversal is interrupted when a node of the current branch is previously visited (a branch being a path of arcs starting at the root node). The resulting rooted tree 260 is illustrated in FIG. 26.

Tree 260 collects all cycles of the graph as follows: each path from the root node to a leaf node is a cycle. It is clear in this example that there exists only one maximum cycle which is (a,b,c,d) and illustrated with boxed letters. This cycle is the local radial order of edges around vertex v retained by the method of the example. It may happen that the maximum cycle is not unique, thus leading to ambiguity. This situation is detailed later.

An example of the determining S30 implemented in the method of FIG. 6 is now discussed.

In this example, determining (S30) edge cycles by browsing the wireframe graph comprises the sub-steps of choosing a vertex and forming an edge list starting from the chosen vertex, and repeating said sub-steps. In other words, vertices are repeatedly chosen and edge lists are formed each time a vertex is chosen, e.g. until all minimal edge lists are determined.

Forming the edge list is performed by following, starting from the chosen vertex, the local radial orders associated to the vertices as they are encountered. In other words, when the algorithm is at a vertex, the algorithm retrieves the first edge provided by the local radial order associated to said vertex (e.g. the method marks edges of the local radial orders as used, such that the algorithm retrieves the first unused edge of the local radial order). Then, the algorithm goes to the other vertex connected to said edge. The algorithm increments the edge list with such followed edges, until the edge list forms an edge cycle. This allows a fast and efficient determination at S30.

Figure 27:
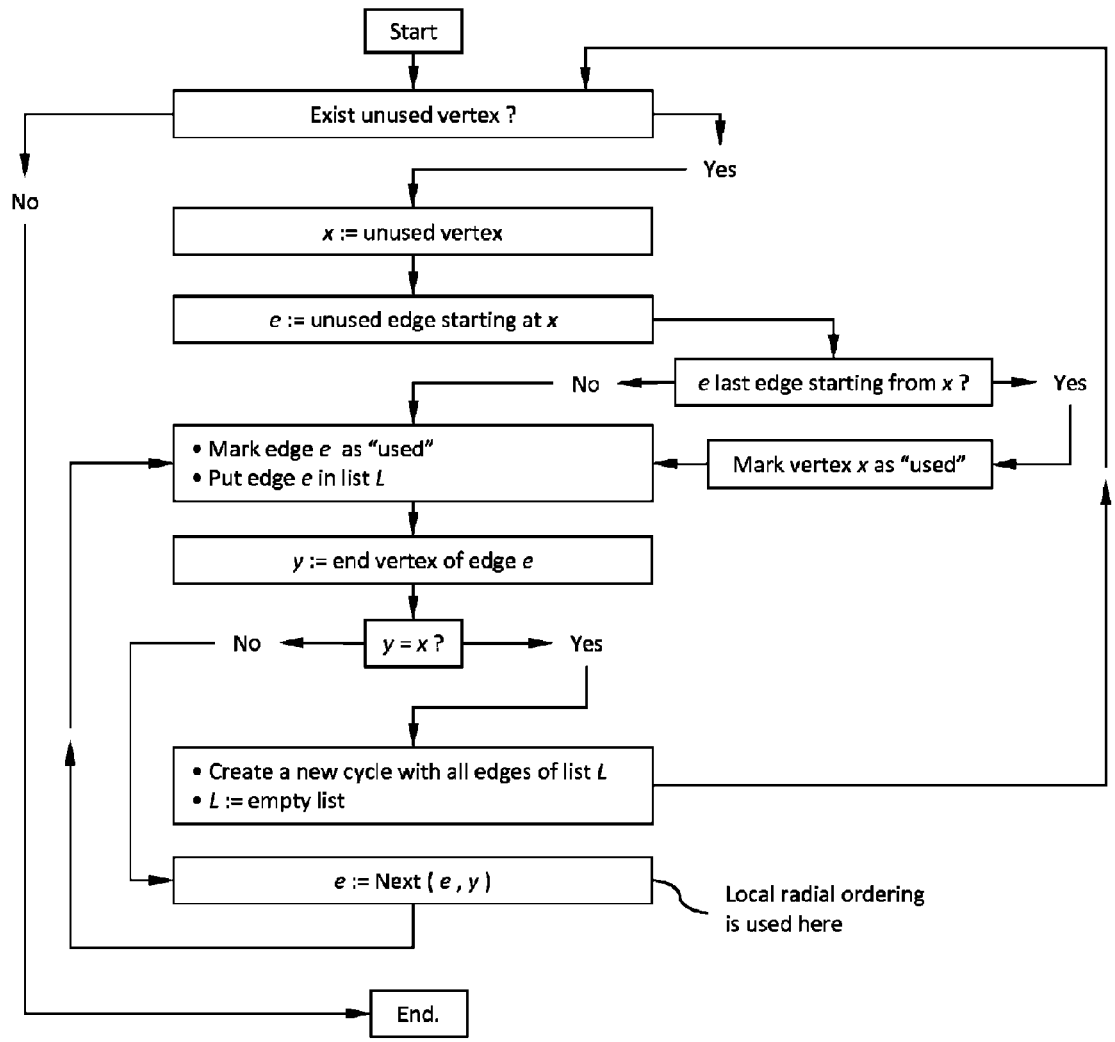
Figure 28:
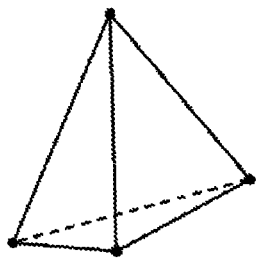

A detailed implementation is provided with reference to FIG. 27.

As can be seen, in the implementation of FIG. 27, determining S30 edge cycles by browsing the wireframe graph comprises the sub-steps of:

choosing a vertex x vertices marked as unused, initializing an edge list L, by selecting an edge e starting at vertex x, adding output edge e of said vertex x to the edge list L and marking the added output edge e as used, if the added output edge e of said vertex is the last unused output edge of said vertex x, marking said vertex x as used, incrementing the edge list L by following the edges according to the local radial orders associated to the vertices as they are encountered, until the edge list L forms an edge cycle, and repeating the preceding sub-steps, discarding vertices and edges marked as used.

The input data for 3D wireframe graph traversal are the 3D wireframe graph together with local radial orders at each vertex. The output data is the list of all minimum cycles of the 3D graph. The following preprocessing is advantageous: all edges of the 3D graph are duplicated and oriented in opposite directions. By definition, an oriented edge is "used" if it is involved in a minimum cycle. A vertex is "used" if all its output edges are used in minimum cycles. Before the algorithm starts, all edges and all vertices are "unused". At the end of the algorithm, each oriented edge is involved in one and only one minimum cycle. The graph traversal algorithm is described in the diagram of FIG. 27.

Instruction "e:=Next (e, y)" uses the local radial order of edges around vertices. Function "b=Next (a, v)" yields the edge "b" starting at vertex "v" and preceding edge "a" according to the local radial order of edges around vertex "v".

As can be seen, the method takes advantage of the local radial orders so that, with a simple but smart marking of vertices and edges as used or unused (after the duplication), the method may easily and efficiently perform the determination S30 of all minimal edge cycles.

The special case of a non-unique local radial order is now discussed with reference to FIGS. 28-40.

This is the case when the traversing S26 of the result of the merging S24 of all the local partial radial orders leads to detecting several (different) cycles including all the edges incident to the respective vertex.

Figure 29:
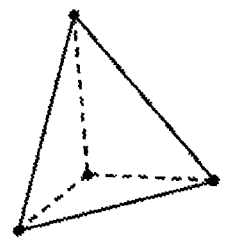
Figure 30:
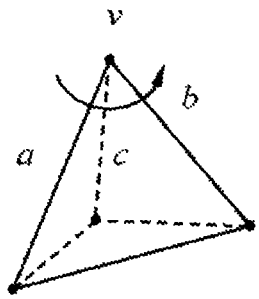
Figure 30:
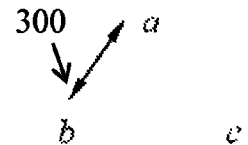
Figure 31:
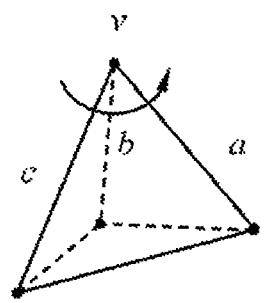
Figure 31:
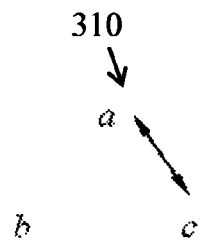
Figure 32:
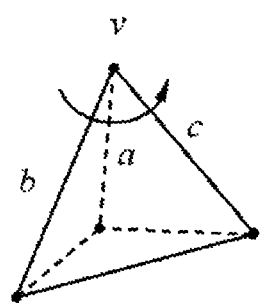
Figure 32:
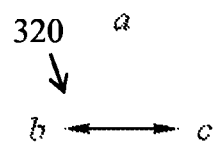

A non-unique local radial order may occur as explained in the following. The example solid is a tetrahedron, as illustrated on FIG. 28. Four pictures of the tetrahedron are given in such a way that only one face is visible on each picture. Each visible face hides all three other faces of the tetrahedron, as illustrated by FIG. 29.

Given a vertex v, only two incident edges are visible on each picture. Noting a,b,c the three incident edges at vertex v, local partial orders are meaningless since they organize a cyclic list of two objects, as illustrated on FIGS. 30-32 which show local partial orders 300, 310 and 320.

Figure 33:
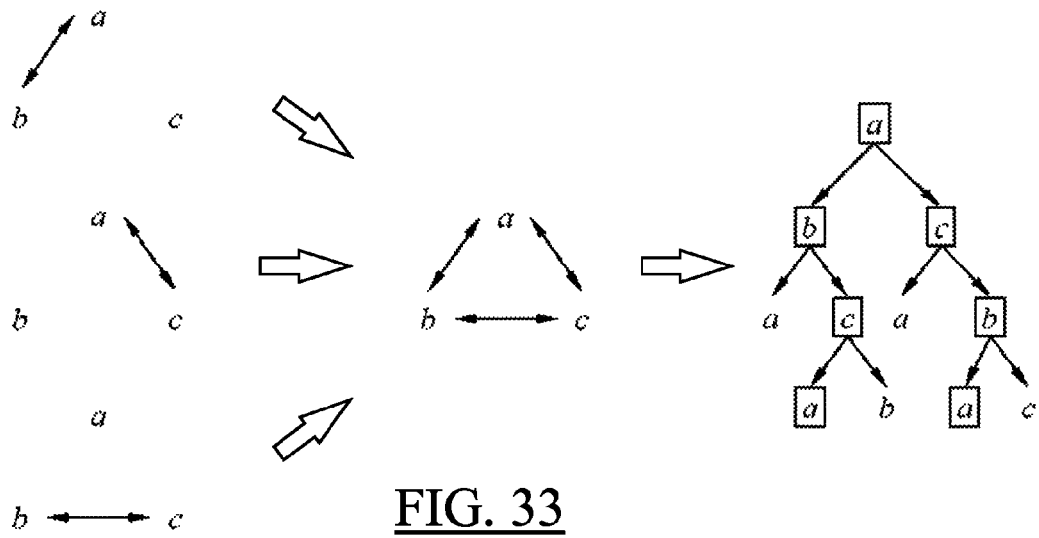

Merging all local partial orders yields a directed graph from which the cycle analysis finds two cycles in opposite orders (a,b,c) and (a,c,b), as on FIG. 33. Clearly, this is not finished.

The method of the example may solve this issue by selecting S28 one of the cycles detected for such a vertex having several different local radial orders (potentially) associated to it, and referred to as "singular" vertex. The method thus selects one cycle as the local radial order used in the determining S30. The method may further comprise marking the vertex as a singular vertex (after the traversal S26), for later use of such information.

Notably, the selecting S28 may be performed indirectly. The selecting S28 one of the cycles detected may indeed comprise performing a regularization process (which is iterative) on the set of all singular vertices.

The regularization process comprises choosing a starting singular vertex and a starting output edge (an edge incident to the chosen singular vertex) of said starting singular vertex. This choosing may be performed in any way. Then the regularization process comprises browsing the wireframe graph following the local radial orders associated to the vertices (i.e. the first edge of the local radial order associated to an edge is followed each time the algorithm arrives at a vertex), in order to detect an edge cycle at said starting singular vertex. Then if the browsing reaches/leads to another singular vertex, the method repeats the regularization process with a new starting singular vertex and/or a new starting output edge (the browsing is indeed facing an ambiguity and the proposed way to solve this ambiguity is to restart somewhere else). Else (i.e. if an edge cycle is detected with no other singular vertex encountered), the method may associate to said starting singular vertex the cycle, that was detected at S26, and that is compliant with the order between the starting output edge and the final edge browsed (the other potential local radial order(s) that are provided by the other cycles detected at S26 in competition are discarded). In other words, the local radial order that is retained is the one in which the starting edge and the ending edge of the cycle detected during the regularization (both edges being incident to the singular vertex under regularization) are ordered correctly (i.e. in the same order as for the detected cycle). Then the method removes the starting singular vertex from the set of all singular vertices (indeed, the singular vertex has been regularized as a unique local radial order has been retained for it), and then repeats the regularization process. This algorithm is executed until no singular vertex remains. Examples are discussed hereunder.

Despite vertices featuring a non-unique local radial order are marginal in images of real life objects, they would better not be ignored. In fact, it is possible to deal with them, generally provided they are not too numerous. (Obviously, in the rare case the method does not manage to regularize the wireframe graph, then it can simply be discarded.) A vertex featuring a non-unique radial order is called a singular vertex in the following.

The principle is as follows. Suppose that all possible local radial orders are computed and start a cycle computation at a singular vertex x. Since the starting edge of the cycle, noted u, is arbitrarily chosen among output edges of x, singularity is not a trouble. If no other singular vertex is encountered while computing the cycle, the algorithm ends the said cycle with an edge v that is an input edge of vertex x. So, it is clear that the appropriate radial order around vertex x is the one featuring the sequence u,v as opposed to the one featuring the sequence v,u. Consequently, it is possible to regularize vertex x by setting the correct local radial order. Then, the strategy is to identify singular vertices while computing local radial orders and to regularize them as much as possible.

Figure 34:
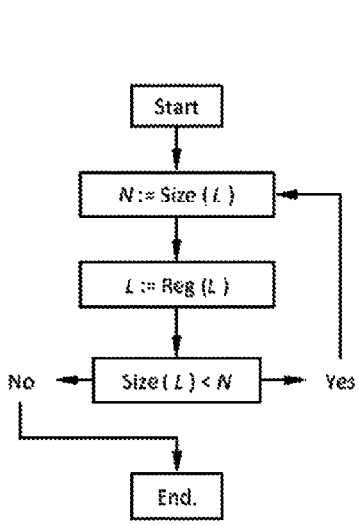
Figure 35:
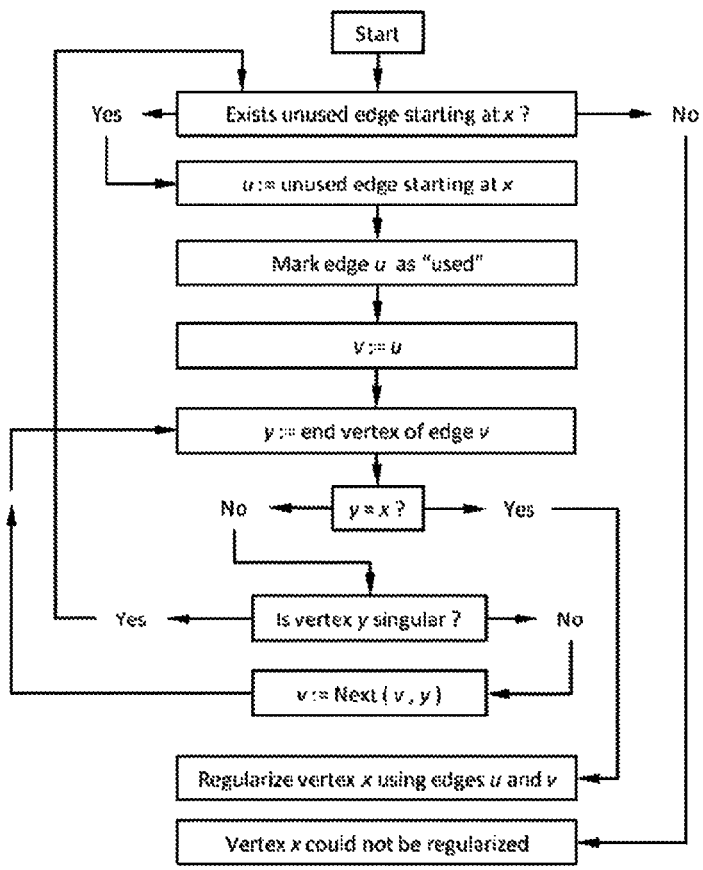

The regularization algorithm is as shown on FIG. 34. After local radial orders are computed, all singular vertices are stored in an initial list L. The main loop is to iteratively remove singular vertices from list L. Iterations are stopped when no singular vertex can be removed.

If the resulting list is not empty, it includes unavoidable singular vertices and cycle computation is not possible. Otherwise, all singular vertices are removed and all local radial orders are unique. The cycles computation described previously will be successful.

Function Reg(L) tries to regularize each singular vertex of the input list L. It modifies list L by removing elements and decreasing its size. If at least one vertex is regularized, there is a chance that a new try regularizes some others, which validates iterations. Function Reg(L) is as follows:

```
Function Reg(L)
For each vertex x ∈ L do begin
    If vertex x is regularized then
        Remove x from list L
    End if
End for
Return L
```

Regularizing vertex x in function Reg(L) is to search a cycle starting at vertex x including only regular vertices but x. This is performed as described in the diagram of FIG. 35.

Figure 36:
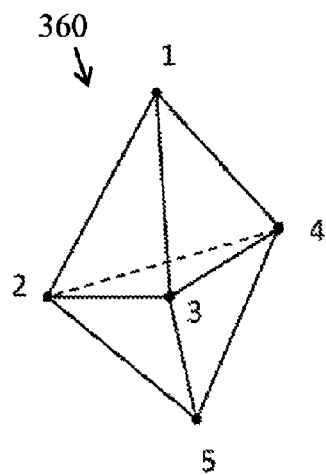

Regularization is exemplified by solid 360 of FIG. 36.

Figure 37:
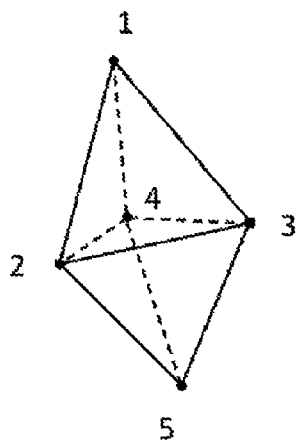
Figure 38:
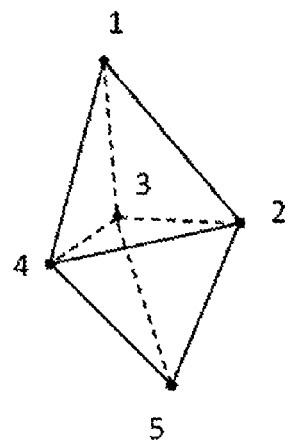
Figure 39:
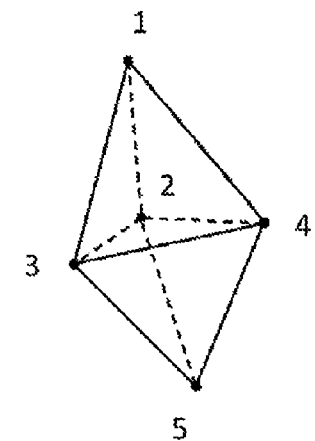

FIGS. 37-39 illustrate three input images of solid 360 of FIG. 36. Notice that hidden lines are represented as dotted lines for clarity and should not appear on images. Vertex 4 is not visible on the image of FIG. 37. Vertex 3 is not visible on the image of FIG. 38. Vertex 2 is not visible on the image of FIG. 39.

Figure 40:
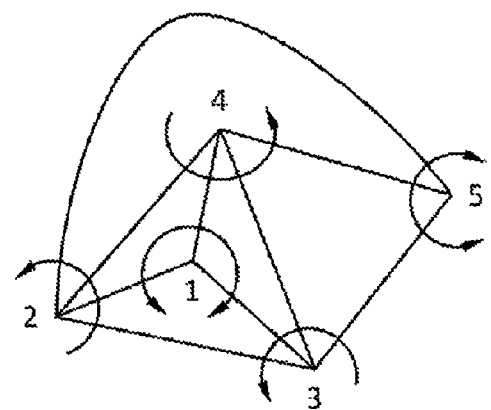

Computed local radial orders are illustrated on FIG. 40. Vertices 1 and 5 are singular since radial orders could not be oriented. It should be noticed that initializing a cycle computation at a regular vertex always fails because any cycle include either vertex 1 or vertex 5, which are singular so far.

The list of singular vertices includes 1 and 5. Regularization starts with vertex 1. Choosing edge (1,3) leads to vertex 3, which is regular. Thanks to local ordering at vertex 3, next edge is (3,4) leading to vertex 4, which is regular. Thanks to local ordering at vertex 4, next edge is (4,1) closing the cycle at vertex 1. Clearly, the appropriate local ordering at vertex 1 is (1,3), (1,4), (1,2) changing it into a regular vertex. Singular vertex 5 is regularized the same way. Then, computation of all cycles is possible.

The algorithmic complexity of the method is now discussed.

Let V, E respectively the number of vertices and edges of the 3D wireframe graph and F the number of faces of the input object, which is also the number of minimum cycles. Let $E_{max}$ the largest number of edges incident to a vertex. Despite $E_{max}$ can be made proportional to E with particular solids, real life objects feature a small and constant $E_{max}$. The previously discussed L-shape solid 60 is such that $E_{max}=3$, the previous V-based pyramid is such that $E_{max}=4$. The algorithmic complexity of the local ordering is bounded by V×Sorting($E_{max}$) where function Sorting(•) is the complexity of the sorting algorithm, typically Sorting(n)=n log n, or Sorting(n)=$n^2$. The algorithmic complexity of graph traversal is proportional to E since each edge is visited twice. Finally, when dealing with regular input objects, the overall complexity of the algorithm is linear, meaning that it is proportional to aE+bV where a, b are constant numbers.

Singularity management marginally affects linearity since the regularization complexity if bounded by S×$V_{max}$×F where S is the number of singular vertices.

Thanks to Euler relations of connected topological graphs V−E+F=2(1−G) (number G is the genus), the number of faces (that is the number of minimum cycles) is a linear combination of the number of vertices and edges. This proves that the algorithm of the method is optimal from the algorithmic complexity point of view.

The invention claimed is:

1. A computer-implemented method for designing a three-dimensional modeled object, comprising the steps of:
providing a plurality of two-dimensional views of the modeled object, the plurality of two-dimensional views being captured images representing a same physical product, having curves and points defined thereon, a three-dimensional wireframe graph comprising edges that connect vertices, and correspondences between the edges and the vertices with respectively curves and points on the views;
associating, to each vertex of the wireframe graph, a local radial order between all the edges incident to each respective vertex, according to local partial radial orders between the curves corresponding to the edges on each of the views with respect to a point corresponding to the respective vertex, by, for each respective vertex:
determining, for each view, the local partial radial order with respect to the point corresponding to the respective vertex between curves that are defined on the view and that correspond to an edge incident to the respective vertex;
merging all the local partial radial orders; and
traversing the result of the merging of all the local partial radial orders to detect a cycle including all the edges incident to the respective vertex, said cycle constituting the local radial order associated to the respective vertex;
determining edge cycles, by browsing the wireframe graph following the local radial orders associated to the vertices; and
fitting the wireframe graph with surfaces based on the determined edge cycles;
wherein the views are images and the wireframe graph is a three-dimensional construction of the modeled object based on the images.

2. The method of claim 1, wherein the local partial radial orders are determined as graphs of which nodes identify edges and of which arcs identify subsequence between edges.

3. The method of claim 1, wherein associating, to each vertex of the wireframe graph, a local radial order between all the edges incident to a respective vertex further comprises, when traversing the result of the merging of all the local partial radial orders leads to detecting several cycles including all the edges incident to the respective vertex, selecting one of the cycles detected for said respective vertex, said respective vertex being a singular vertex.

4. The method of claim 3, wherein selecting one of the cycles detected comprises performing a regularization process on the set of all singular vertices, the regularization process comprising:

choosing a starting singular vertex and a starting output edge of said starting singular vertex;

browsing the wireframe graph following the local radial orders associated to the vertices to detect an edge cycle at said starting singular vertex; and then:

if reaching another singular vertex, repeating the regularization process with a new starting singular vertex and/or a new starting output edge, else, associating to said starting singular vertex the cycle, detected when traversing the result of the merging of all the local partial radial orders leads, that is compliant with the order between the starting output edge and the final edge browsed, removing the starting singular vertex from the set of all singular vertices, and then repeating the regularization process until no singular vertex remains.

5. The method of claim 1, wherein, determining edge cycles by browsing the wireframe graph comprises the sub-steps of:

choosing a vertex;

forming an edge list by following, starting from the chosen vertex, the local radial orders associated to the vertices as they are encountered, and incrementing the edge list with the followed edges, until the edge list forms an edge cycle; and repeating the preceding sub-steps.

6. The method of claim 1, wherein the method further comprises, prior to providing the views, the wireframe graph, and the correspondences:

capturing images of the same physical product;

defining curves and points on the images, thereby forming the views;

defining correspondences between the curves and points of each image with respectively curves and points on the other images; and constructing the wireframe graph based on the views and on the correspondences, the wireframe graph thereby constructed comprising edges that connect vertices, and correspondences between the edges and the vertices with respectively curves and points on the views.

7. The method of claim 1, wherein the images are photos.

8. A three-dimensional modeled object obtainable by the method of claim 1.

9. A data file storing the three-dimensional object of claim 8.

10. A computer program product comprising:

a non-transitory computer readable medium; and instructions embedded on the computer readable medium configuring a processor to:

provide a plurality of two-dimensional views of the modeled object, the plurality of two-dimensional views being captured images representing a same physical product having curves and points defined thereon, a three-dimensional wireframe graph comprising edges that connect vertices, and correspondences between the edges and the vertices with respectively curves and points on the views;

associate, to each vertex of the wireframe graph, a local radial order between all the edges incident to each respective vertex, according to local partial radial orders between the curves corresponding to the edges on each of the views with respect to a point corresponding to the respective vertex, by, for each respective vertex:

determining, for each view, the local partial radial order with respect to the point corresponding to the respective vertex between curves that are defined on the view and that correspond to an edge incident to the respective vertex;

merging all the local partial radial orders; and traversing the result of the merging of all the local partial radial orders to detect a cycle including all the edges incident to the respective vertex, said cycle constituting the local radial order associated to the respective vertex; and then determine edge cycles, by browsing the wireframe graph following the local radial orders associated to the vertices; and fit the wireframe graph with surfaces based on the determined edge cycles;

wherein the views are images and the wireframe graph is a three-dimensional construction of the modeled object based on the images.

11. The computer program product of claim 10 wherein the computer readable medium is a data storage.

12. A computer-aided design (CAD) system comprising:

a computer memory; and a processor coupled to the memory and a graphical user interface, the memory having recorded thereon a computer program for designing a three-dimensional modeled object by:

providing a plurality of two-dimensional views of the modeled object, the plurality of two-dimensional views being captured images representing a same physical product, having curves and points defined thereon, a three-dimensional wireframe graph comprising edges that connect vertices, and correspondences between the edges and the vertices with respectively curves and points on the views;

associating, to each vertex of the wireframe graph, a local radial order between all the edges incident to each respective vertex, according to local partial radial orders between the curves corresponding to the edges on each of the views with respect to a point corresponding to the respective vertex, by, for each respective vertex:

determining, for each view, the local partial radial order with respect to the point corresponding to the respective vertex between curves that are defined on the view and that correspond to an edge incident to the respective vertex;

merging all the local partial radial orders; and traversing the result of the merging of all the local partial radial orders to detect a cycle including all the edges incident to the respective vertex, said cycle constituting the local radial order associated to the respective vertex; and then determining edge cycles, by browsing the wireframe graph following the local radial orders associated to the vertices; and fit the wireframe graph with surfaces based on the determined edge cycles;

wherein the views are images and the wireframe graph is a three-dimensional construction of the modeled object based on the images.

13. The CAD system as in claim 12 wherein:

the local partial radial orders are determined as graphs of which nodes identify edges and of which arcs identify subsequence between edges.

14. The CAD system as in claim 12 wherein:

associating, to each vertex of the wireframe graph, a local radial order between all the edges incident to a respective vertex further comprises, when traversing the result of the merging of all the local partial radial orders leads to detecting several cycles including all the edges incident to the respective vertex, selecting one of the cycles detected for said respective vertex, said respective vertex being a singular vertex.

15. The CAD system as in claim 12 wherein:
the views are images and the wireframe graph is a three-dimensional construction of the modeled object based on the images.

16. The CAD system as in claim 12 further comprising fitting the wireframe graph with surfaces based on the determined edge cycles.

* * * * *